(12) United States Patent
Skipor et al.

(10) Patent No.: US 7,108,914 B2
(45) Date of Patent: Sep. 19, 2006

(54) SELF-HEALING POLYMER COMPOSITIONS

(75) Inventors: Andrew Skipor, West Chicago, IL (US); Steve Scheifer, Hoffman Estates, IL (US); Bill Olson, Lake Villa, IL (US)

(73) Assignee: Motorola, Inc., Schaumburg, IL (US)

( * ) Notice: Subject to any disclaimer, the term of this patent is extended or adjusted under 35 U.S.C. 154(b) by 13 days.

(21) Appl. No.: 10/195,858

(22) Filed: Jul. 15, 2002

(65) Prior Publication Data

US 2004/0007784 A1 Jan. 15, 2004

(51) Int. Cl.
*B32B 5/16* (2006.01)
*C08K 9/02* (2006.01)
*C08K 9/00* (2006.01)
*C08K 9/10* (2006.01)

(52) U.S. Cl. ............... 428/402.21; 523/204; 523/205; 523/210

(58) Field of Classification Search ........... 428/402.21, 428/320.2; 523/204, 205, 210
See application file for complete search history.

(56) References Cited

U.S. PATENT DOCUMENTS

| | | | |
|---|---|---|---|
| 5,196,267 A | 3/1993 | Barder et al. | |
| 5,561,175 A | 10/1996 | Imagawa | |
| 5,660,624 A | 8/1997 | Dry | |
| 5,803,963 A | 9/1998 | Dry | |
| 5,965,866 A | 10/1999 | Mederski | |
| 5,989,334 A | 11/1999 | Dry | |
| 6,177,921 B1 | 1/2001 | Comiskey et al. | |
| 6,255,138 B1 | 7/2001 | Haishima | |
| 6,261,360 B1 | 7/2001 | Dry | |
| 6,310,121 B1 | 10/2001 | Woodson, Jr. et al. | |
| 6,313,332 B1 | 11/2001 | Grubbs et al. | |
| 6,518,330 B1 * | 2/2003 | White et al. ............... 523/200 |
| 6,527,849 B1 | 3/2003 | Dry | |
| 6,548,763 B1 * | 4/2003 | Kaltenborn et al. .... 174/137 B |
| 2004/0007784 A1 | 1/2004 | Skipor | |

FOREIGN PATENT DOCUMENTS

WO WO 02/064653 8/2002

OTHER PUBLICATIONS

Namyong Y. Kim, Noo Li Jeon, Insung S. Choi, Seiichi Takami, Yoshiko Harada, Krista R. Finnie, Gregory S. Girolami, Ralph G. Nusso, George M. Whitesides, and Paul E. Laibinis; Title: Surface-Initiated Ring-Opening Metathesis Polymerization on Si/SiO$_2$; pp. 2793-2795; Published Mar. 31, 2000 on the Web:: 2000 American Chemical Society.

(Continued)

Primary Examiner—Cathy F. Lam (57) ABSTRACT

A self-healing polymer composition 10 contains a polymer media 12 and a plurality of microcapsules of flowable polymerizable material 16 dispersed in the polymer media 12, where the microcapsules of flowable polymerizable material 16 contain a flowable polymerizable material 15 and have an outer surface 142 upon which at least one polymerization agent 13 is chemically attached. The microcapsules 16 are effective for rupturing with a failure of the polymeric media 12, and the flowable polymerizable material 15 reacts with the polymerization agent 13 when the polymerizable material 15 makes contact with the polymerization agent 13 upon rupture of the microcapsules 14. There is also provided a method of using the self-healing polymeric composition 10 to repair fractures in polymers, as well as articles of manufacture including the self-healing system, and the microencapsulated polymerizable particles 16 themselves.

15 Claims, 5 Drawing Sheets

OTHER PUBLICATIONS

Nichole R. Grove, Paul A. Kohl, Sue Ann Bidstrup Allen, Saikumar Jayaraman, Robert Shick; Journal of Polymer Science Part B: Polymer Physics, vol. 3, Title: Functionalized Polynorbornene Dielectric Polymers: Adhesion and Mechanical Properties; pp. 3003-3010; Publisher John Wiley & Sons, Inc.; Received Jan. 12, 1999; Revised Jul. 13, 1999; accepted Jul. 30, 1999.

Marcus Weck, Jennifer J. Jackjw, Robert R. Rossi, Paul S. Weiss, and Robert H. Grubbs; Journal of American Chemical Society, vol. 121, Title: Ring-Opening Metathesis Polymerization from Surfaces; pp. 4088-4089; Published on Web Apr. 14, 1999.

S.R. White, N.R. Sottos, P.H. Geubelle, J.S. Moore, M.R. Kessler, S.R. Sriram, E.N. Brown and S. Viswanathan, Nature, vol. 409, Title: Autonomic healing of Polymer Composites, pp. 794-797; Feb. 15, 2001.

C. Dry et al., "Passive smart self-repair in polymer matrix composite materials," School of Architecture, University of Illinois at Urbana-Champaign; Department of Theoretical and Applied Mechanics, University of Illinois at Urbana-Champaign, SPIE, vol. 1916, pp. 438-444.

Chen, X.; Dam, M.; Ono, K.; Mal, A.; Shen, H.; Nutt, S.; Sheran, K.; Wudl, F. "A Thermally Re-Mendable Cross-Linked Polymeric Material" Science vol. 295 Mar. 1, 2002 www.sciencemag.org.

* cited by examiner

SELF-HEALING POLYMER COMPOSITIONS

FIELD OF THE INVENTION

This invention relates generally to self-healing polymer compositions. The self-healing polymer compositions include microencapsulated polymerizable compositions that are activated upon failure of a polymer composition and which are effective for healing failures in polymer compositions.

BACKGROUND OF THE INVENTION

A recurring issue in product applications using materials such as polymeric materials is that they tend to fail or degrade due to mechanical fatigue, mechanical impact, oxidative aging due to radiation or impurities, thermal fatigue, chemical degradation, or a combination of these processes. The degradation can lead to embrittlement of the polymer, among other adverse effects. The embrittlement and associated cracking can advance to the point that it causes product failure, which creates replacement costs. Mechanical fatigue and mechanical stress, such as that caused by dropping the object, can also lead to cracks that eventually cause failure. Thermoplastic and thermoset polymer systems used in products can be particularly susceptible to these failure modalities.

This problem is a great concern because of the widespread and intensive use in modem society of polymers in product components. For instance, polymers have a significant importance and presence in the electronics industry. Examples of applications include printed circuit board (PCB) laminates, housings, enclosures, adhesives, die attach, component packaging, and organic semi-conductors. In addition to the above-mentioned failure modes, other degradation processes, such as redox reactions or chemical diffusion, can be expected in organic semi-conductors and in electrically conductive polymers (which degrade their characteristics).

Traditional approaches to increasing the reliability of polymeric-based components and products have included a focus on suitable design enhancements and the use of incrementally improved plastics. Recently, a significant increase in the availability of so-called 'smart" materials has occurred, which relates to materials that can sense impending failure and facilitate appropriate corrective measures to prevent extensive damage. Alternatively, if the damage has already occurred, some new material systems can purportedly self-heal the damaged structure. See, e.g., Chen, et al., "A Thermally Re-Mendable Cross-Linked Polymeric Material," Science, Vol. 295, March 2002, pp. 1698–1702.

One recently developed process intended to impart self-healing capability to a polymer involves the incorporation of microcapsules containing a healing agent in a polymer matrix. White, S. R., et al., Nature, "Autonomic Healing of Polymer Composites," 409, 794–797 (2001). The healing agent enclosed in the microcapsules is dicyclopentadiene (DCPD). A ruthenium polymerization agent, corresponding to CAS No. 172222-30-9, is dispersed in the polymer matrix. When a fracture occurring in the polymer matrix propagates in close proximity of the microcapsules, the associated stresses caused by the fracture rupture the microcapsules. As a consequence, the healing agent is released from the ruptured microcapsules and contacts the fracture surfaces. It also comes into contact with a polymerization agent dispersed in the polymer matrix to the extent the dispersed polymerization agent is located in the direct vicinity of the fracture and released healing agent. The polymerization agent is functionally active in the presence of moisture and air (oxygen source). When the polymerization agent contacts the self-healing agent, it promotes polymerization of the healing agent, resulting in filling of the crack planes of the fracture. This filling arrests fracture propagation and reduces the compliance of the post-fractured matrix material.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention. Additionally, descriptions and details of well-known features and techniques may be omitted from the figures to avoid unnecessarily obscuring the present invention.

DETAILED DESCRIPTION

The present invention is directed to a microencapsulated polymerizable composition, a method of making the microencapsulated composition, a self-healing polymer composition and a method for making the self-healing composition. The microencapsulated composition includes microcapsules, flowable polymeric material inside the microcapsules, and a polymerization agent attached to an outer surface of the microcapsules. The self-healing polymer composition of the invention includes a plurality of the microcapsules of flowable polymeric material dispersed in a polymer media. Upon failure of the polymer composition and rupture of the microcapsules, the flowable polymeric material contacts a polymerization agent that is attached to the surface of the microcapsules in manners such as described herein and reacts to heal the failure in the polymer media. The attachment of the polymerization agent to the microcapsules assures a uniform dispersion of polymerization agent associated with polymerizable material throughout the polymer media such that when and if a failure or fracture of the medial occurs, the polymerization agent will be in proximity of the microcapsule to promote polymerization of the material inside the microcapsule and "self heal" the polymer media in which the microcapsules are dispersed.

As used herein the term "failure" or "failure in the polymer media" refers to a crack initiated in the polymer media or a loss of functionality created by a loss of cohesion within the media. The polymer media is "healed" when a crack initiation has been halted or some new cohesion or adhesion has been substituted for the loss of cohesion within the media. In this aspect of the invention, healing generally occurs by both arresting the crack initiation and a replacement of cohesion loss by adhesion or possibly cohesion depending on the polymer systems used. There also are attendant mechanical benefits to incorporating the microcapsules as they provide energy dissipation and arrest the crack advance. Reaction times for the healing mechanism can run from minutes to hours depending on the healing system used. In one aspect, the reaction time is several minutes (i.e., about 2–4 minutes). Temperatures can play an important role for any particular reaction, with higher temperatures promoting faster healing times. Where desired, a strength test can be conducted on a polymeric component incorporating the healing system described herein after a period of about 24 hours. The ratio of strength to crosslinking density in the healed polymeric components generally increases with temperature and increases with time.

In one aspect, the invention is directed to making the microencapsulated polymerizable composition with the polymerization agent attached thereto. In one exemplary aspect, the microencapsulated composition is made by attaching the polymerization agent to the surface of the microcapsule via a molecular bridge unit in which difunctional linear molecules are attached to gold-coated, functionalized surfaces of the microcapsules such that the linear bridge units significantly protrude from the surfaces, followed by integral addition of a polymerization agent at a site on the protruding linear molecules, and thereafter initiation of ring-opening metathesis polymerization (ROMP) is conducted to provide the microencapsulated composition. In one aspect, the "polymerization agent" is used to form an active site on the protruding linear molecule which site functions as a polymerization initiator and/or promoter for the polymerizable material.

In another aspect, the present invention provides a process for making a self-healing composition. In accordance with the process, the microcapsules described herein are dispersed in a polymer media. The dispersion is sufficient if the resulting modified polymeric matrix performs as intended insofar as imparting the self-healing functionality described herein. This can be readily verified through prototype studies based on a given set of preparation steps and materials, and reproduction or accelerated reproduction of anticipated environmental conditions in which the microencapsulated composition will be applied. A uniform dispersion or essentially uniform dispersion of the microcapsules in a polymeric matrix is generally preferred, but may not be required for all applications.

Yet in another aspect, the invention includes articles of manufacture made from the self-healing composition.

Microcapsules

The microcapsules, also referred to as hollow microspheres, microbubbles or microballoons, are small bodies having solid walls fabricated to enclose the material that is polymerizable in the presence of the polymerization agents described herein. Microcapsules can be fabricated in a diameter range of several hundred micrometers or less. The external diameters of a given sample or lot of microcapsules used also may have a size distribution range. In general, the microcapsules may have an average external diameter less than about 250 micrometers, and the average size may range anywhere from about 10 to about 250 micrometers that depends on the application envisioned. For example, the use of the microcapsules in adhesive applications and resins for fiber reinforced composite structures may be enhanced when microcapsules sizes less than about 100 micrometers are employed. The thickness of the shells or walls of the microcapsules are selected to be functionally sufficient for the healing application in order to essentially preclude premature rupture of the microcapsules under normally encountered compressive or tensile forces that are less than those consistent with microcracking, which might occur in the filled plastic matrix. The thickness of the microcapsules, for instance, can be about 1.5 micrometers in many commercially available products. In one embodiment, the microcapsules are generally spherical in shape, but that geometry is not required. The outermost walls of the microcapsules can be formed, for example, of hydrous metal oxide, silica, borosilicates, and so forth; silicate type sol-gel precursors, such those described in U.S. Pat. No. 5,196,267, which descriptions are incorporated herein by reference; carbon; or polymers such as urea-formaldehyde, phenolics, and so forth. In one exemplary aspect of the invention, the microcapsules are formed of urea-formaldehyde and are spherical with an average external diameter of about of about 10 to about 200 microns. Microcapsules smaller than 10 microns are also encompassed with the understanding that wall thickness generally increases with increasing microcapsule diameters, and that the fracture strength of the microcapsule generally will increase with increasing wall thickness. These parameters can be adjusted to accommodate the application envisioned using the self-healing system comprising the surface-modified microcapsules described herein.

Flowable Polymerizable Material

The polymerizable material encapsulated in the microcapsules of the present invention can be comprised of suitable monomers, oligomers, or combinations thereof. In addition, small amounts of solvents may be incorporated to facilitate the material flow, especially when oligomeric units are employed as the healing agent. In a primary embodiment, the healing agent is a material having a viscosity permitting it to flow out of the microcapsules under the expected use conditions of the product containing the self-healing composites sufficient to come into contact with polymerization agent attached to the microcapsule. In this aspect of the invention, the flowable polymerizable material generally has viscosity and rheological characteristics that permit it to flow at the expected operating temperature in which the polymeric matrix is used. A solvent can be included inside the microcapsule together (e.g., physically mixed) with the polymerizable material in an amount effective to facilitate the flow of the polymerizable material upon rupture of the microcapsule. When used, the solvent generally is selected to be a liquid or flowable material at the temperature at which the self-healing polymer composition is expected or designed to be used. The solvent, when used, preferably is chemically inert relative to the polymerizable material, and the polymerization agent and polymerization agent attachment system.

Examples of flowable polymerizable material effective for use in the present invention include a monomeric material comprising norbornene (bicyclo[2.2.1]hept-5-ene) (see, e.g., CAS No. 498-66-8), which is occasionally abbreviated herein as "NB"; triethoxysilylnorbornene (TESNB) in which the functional group is —Si—$(OC_2H_5)_3$; and alkyl-substituted norbornene derivatives such as ethylnorbornene (EthNB) in which the functional group is —$CH_2CH_3$, butylnorbornene (BuNB) in which the functional group is —$(CH_2)_3CH_3$, and hexylnorbornene (HexNB) in which the functional group is —$(CH_2)_5CH_3$); and mixtures thereof. In an important aspect of the invention, the flowable polymerizable material is triethoxysilylnorbornene.

Figure 8:
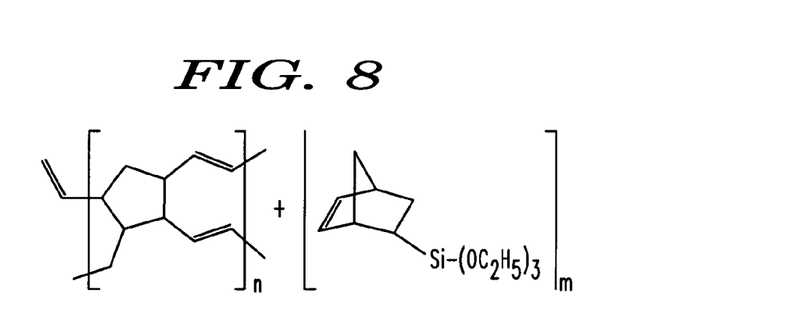
FIG. 8 illustrates preparation of a healing agent from combination of partially polymerized DCPD, where n is small, and partially polymerized triethoxysilylnorbornene (TESNB), where m is the number of units in the oligomer, according to another embodiment of the invention.

Alternatively, the healing agent can be comprised of partially polymerized species (oligomers), such as oligomers of one or more of $DCPD_n$, norbornene derivatives such as $TESNB_m$, and oligomers of simple alkyl derivatives of norbornene such as $HexNB_q$, where the coefficients n, m and q represent positive numbers associated with small-scale polymerizations. A partially co-polymerized DCPD with any of the above NB and NB-derivatives could also be used as the healing agent. For instance, and as illustrated in FIG. 8, the healing agent can be prepared by combination of partially polymerized DCPD, where n is a relatively small number, and partially polymerized TESNB, where m is the number of units in the oligomer.

Figure 9:
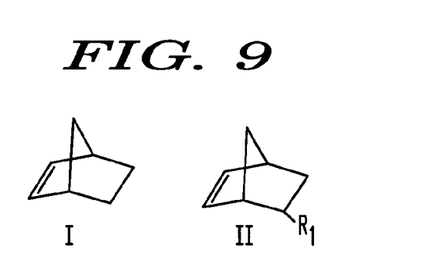
FIG. 9 illustrates a norbornene healing agent (structure I), and a derivative thereof (structure II), either or both of which can be used as the healing agent according to other embodiments of the invention.

FIG. 9 illustrates examples of the healing agent as comprised of NB as shown by structure I, and as an NB-derivative as shown by structure II in which the "$R_1$" groups represents an alkyl group. Compounds corresponding to structures I or II in FIG. 9, can be used individually or in combination with each other or other suitable compounds as the healing agent. NB-derivatives that can be used as the polymerizable material described for use herein include NB-derivative compounds such as those described by Grove et al., "Functionalized Polynorbornene Dielectric Polymers: Adhesion and Mechanical Properties, J. of Polymer Science: Part B: Polymer Physics, Vol. 37, 3003–3010, 1999, which are incorporated herein by reference.

The polymerizable healing agent material can be encapsulated inside the microcapsules by suitable techniques presently known or that will be known for that general purpose. One example of a technique that can be used to encapsulate polymerizable material is described by White, S. R., et al, Nature, vol. 409, pp. 794–797 (2001), which is incorporated herein by reference. Generally, encapsulation may be conducted by dissolving urea in resorcinol and ammonium chloride. Ethylene maleic anhydride is added (about 5 weight percent) and pH is controlled using sodium hydroxide. While stirring, DCPD is added, followed by addition of formaldehyde, and then addition of water to the reaction mixture. The microcapsules are vacuum filtered.

Polymerization Agent

The polymerization agent that is attached to the surface of a microcapsules is a material that will induce and/or promote polymerization of the particular self-healing agent or reagent(s) enclosed within the microcapsules when the self-healing agent comes into contact with the polymerization agent, such as when the microcapsules are ruptured by cracking in the polymeric media.

In one embodiment, the polymerization agent compounds form active sites on the surface of the microcapsules for ring-opening metathesis polymerization (ROMP). Particularly, in one embodiment they induce the polymerization of cyclic olefin material released from the microcapsule via ring-opening metathesis. In one aspect, ruthenium, osmium, or indium salts and their derivatives that exhibit this functionality can be used as the polymerization agent. Non-limiting examples include ruthenium, indium or osmium compounds or complexes exhibiting metathesis activity. In one aspect, the polymerization agents having the requisite metathesis activity are derived from $RuCl_3$, $Ru(H_2O)_6$-$(tos)_2$ in which "tos" is toluene sulfonate, $K_2RuCl_5$, and the like. In another aspect, the polymerization agents are transition metal complexes. In one preferred aspect, the polymerization agents can be organometal complexes selected from among ruthenium carbene complexes, indium carbene complexes, or osmium carbene complexes, or combinations thereof, which exhibit metathesis activity.

The ruthenium, indium or osmium carbene complexes exhibiting metathesis activity include those having the general formula:

in which M is a metal such as ruthenium, indium or osmium; $Y_1$ and $Y_2$ are independently an anionic ligand; $Q_1$ and $Q_2$ are each a neutral electron donor ligand; and $R_1$ and $R_2$ are each hydrogen or a substituent group such as substituted or non-substituted $C_2$–$C_{20}$ alkenyl, $C_2$–$C_{20}$ alkynyl, $C_2$–$C_{20}$ alkyl, aryl, $C_2$–$C_{20}$ carboxylate, $C_2$–$C_{20}$ alkoxy, $C_2$–$C_{20}$ alkenyloxy, $C_2$–$C_{20}$ alkynyloxy, aryloxy, $C_2$–$C_{20}$ alkoxycarbonyl, $C_2$–$C_{20}$ alkylthio, $C_2$–$C_{20}$ alkylsulfonyl, $C_2$–$C_{20}$ alkylsulfinyl, and so forth. The optional substitution made on these groups can be, if used, lower alkyl, halogen, lower alkoxy, and aryl such as phenyl. Non-limiting examples of such ruthenium or osmium carbene complexes exhibiting metathesis activity include, for example, $RuCl_2(PCy_3)_2$ (=$CH_2$), $RuCl_2(PCy_3)_2$(=CHPh), $RuCl_2(PCy_3)_2$ (=$CHCO_2Me$), $RuCl_2(PCy_3)_2$(=CH—CH=$CMe_2$), $Ru(H)(Cl)(PCy_3)_2$(=CH—CH=$CMe_2$), and so forth, in which "Cy" is cyclohexyl or cyclopentyl, "Ph" is phenyl and "Me" is methyl. Techniques suitable or adaptable for synthesizing such polymerization agent compounds themselves include those that are generally known or available in the art. Although not required for the practice of this embodiment, non-limiting illustrations for making the ruthenium, indium or osmium carbene complexes include those described in U.S. Pat. Nos. 6,310,121 and 6,313,332, which descriptions are incorporated herein by reference.

Not withstanding the above examples of polymerization agents, there are also other types of polymerization agents that can be tethered to the microcapsule to achieve comparable results. For example, $RBF_2$, where R is the molecular bridging unit, can be used as the polymerization agent for dicyclopentadiene self-healing agent. Other Lewis acids that act as polymerization agents in the same manner as $RBF_2$ include derivatives of aluminum (III), titanium (IV, and tin (IV). Anionic polymerizations can be carried out in a like manner by using Lewis bases. However, the reactivity required of these polymerization agents to polymerize alkenes generally limits the usefulness of these materials for use in self-healing applications. Still other examples of polymerization agents include the use of amine, acid, or alcohol functional groups tethered to the microcapsule. The resulting polyamides or polyesters would be the polymer formed from the self-healing agent. For example, tethering an acid group on the microcapsule as the polymerization agent can be used with glycolic acid self-healing agent to form polyglycolic acid. Some limitations occur with these reactions since water is eliminated and must be adequately absorbed or permeable in the polymer media that it is used inside. These reactions usually require mild heating that is easily achievable, for example, in the summer inside the cabin of closed vehicles. These examples are given, not as limitations, but as illustrations to show the wide applicability of this invention, not withstanding any specific applications or generality of usefulness.

Attachment of Polymerization Agent

In an important aspect of the invention, polymerization agent is attached to an outer (exterior) surface of the microcapsule. As used herein, "attached" means the polymerization agent is directly joined, or indirectly joined via an intervening molecular attachment structure, to the outer surface of the microcapsules. In one preferred aspect, the polymerization agent is attached to the molecular attachment structure via a chemical reaction.

As used herein, the "outer surface" of the microcapsules means the bare surface of the microcapsules themselves, or, alternatively, the surface of a thin film coating or coatings that has been integrally applied upon the bare surface of the microcapsules.

In one aspect of the invention, appropriate functional groups may be attached to the monomers used to make the microcapsule in a manner effective for facilitating attachment of the polymerization agent to the outer surface of the microcapsule. For example, a small alcohol function could be attached to urea nitrogen ($H_2NCONHROH$) used to fabricate a microcapsule made of urea formaldehyde. The alcohol group thereof provides a site for attachment of a polymerization agent using, for example, a chlorosilane coupling agent or a carboxylic acid derivative thereof.

In another aspect, the surfaces of glass or ceramic microcapsules can be treated with the surface specific bonding agent and treated with a polymerization agent solution to bond the polymerization agent directly to the surfaces of the ceramic or glass microcapsules. One example of a surface specific bonding agent is a silanization agent, such as one having the general formula $R—Si(OR')_3$ where R' is a lower alkyl group such as methyl, ethyl, propyl, isopropyl, vinyl or a butyl group. The surface specific bonding agent reacts with surface hydroxy species on the surface of the microcapsule to produce R—Si—O-surface type linkages and produce an alcohol (R'OH) by product. In one embodiment, the R group on the surface specific bonding agent is an olefin-containing hydrocarbon-based moiety that is capable of complexing to a polymerization agent metal center.

In one non-limiting aspect, the microcapsule surfaces are treated with a silane coupling agent having groups comprising norbornene or norbornene derivatives. Examples of these silane coupling agents are 5-(Bicycloheptenyl)trichlorosilane, 5-(Bicycloheptenyl)triethoxysilane, and a coupling agent similar to norbornene-trichlorosilane (5-(bicycloheptenyl)trichlorosilane) except modified such that the trichlorosilane is attached to the carbon on norbornene via an ethylene (—CH2—CH2—) group, or 5-(bicycloheptenyl) methyldichlorosialne In an alternative aspect, the DCPD can be attached to a silane coupling agent. After the silane coupling agent is attached to the exterior surfaces of the microcapsules, the ring of the exposed norbornene group or norbornene derivative group of the silane coupling agent is reacted with the polymerization agent to be attached to the microcapsules. This reaction opens the strained ring such that the polymerization agent is attached to the remaining broken norbornene group. Subsequent polymerization can take place with norbornene or other similarly strained olefins.

Other surface-attachment chemistries may require the microcapsules to have a thin metal film, such as gold, flashed onto the exterior surface to aid in tethering the polymerization agent to the microcapsule surface using a surface specific bonding agent. In this aspect of the invention, gold can be applied using an electroless plating process commonly used in electronic industry to protect metal surfaces from oxidizing. A coupling agent used generally with gold, in which no particular substrate or topography is characterized, has been a thiol compound such as described by Weck et al., *JACS*, 121, 4089—4089 (1999).

In one exemplary aspect, microcapsule surfaces are coated with a gold film, and then they are first functionalized with dodecanethiol to form an alkanethiolate self-assembled monolayer (SAM) matrix. Individual difunctional linear molecules are then inserted into the structural domain boundaries of the SAM effective to support and separate them as a bristled-like structure. As an example of a molecular self-assembly chemistry involving such difunctional linear molecules is generally described in Weck et al., *J. Am. Chem. Soc.*, 1999, 121, 4088–4089, which descriptions are incorporated herein by reference.

In an aspect of the present invention, molecular self-assembly reaction mechanisms are successfully used and applied to attach a polymerization agent having metathesis activity to a three-dimensional (e.g., convex) exterior surface of a friable microcapsule containing a polymerizable healing agent. In the present invention, the resulting "bristled" microcapsule structures each have molecular "bristles" (i.e., the bridging units) protruding outward from the gold-coated surface of the microcapsules, which are amenable to reaction with Ru-based ROMP initiators and the like via living polymerization. The "bristles" or bridging units are effectively spaced apart by intermolecular forces that help to drive the self-assembly process. Intramolecular forces also affect the nature of the SAM. For instance, the linear difunctional compound described in said Weck et al. paper is a relatively stiff molecule that will extend straight out from the surface of the microcapsule to which it is attached at one end. The linear difunctional compound described has the general structure:

where each Z represents a p-phenylene group and X represents a norbornenyl group. This manner of attachment advantageously exposes the double bond of the norbornenyl group located near the opposite distal end of the molecule for subsequent polymerization reaction with the polymerization agents).

In this manner, the attachment of the polymerization agent is provided via chemical reactions effective to link the polymerization agent to the outer surface of the microcapsules via a linear multi-functional molecular bridging unit.

Multiple moieties of the polymerization agent can be attached around the exterior of a common microcapsule in a spaced apart arrangement by provision of multiple linear bridging units attached to the outer surfaces of the same microcapsules.

Polymer Media

The polymeric matrix material that can be protected by the self-healing system of this present invention is not particularly limited. Polymers are used as the primary structural material in a vast array of products and components, in which an in situ fracture healing capability would be a desirable and valued attribute. Polymers that can advantageously incorporate the self-healing capability provided by this invention include thermosetting resins, thermoplastics, and elastomers. Thermosetting resins include temperature-activated systems, polymerization agent-activated system, and mixing-activated systems. Examples of thermosetting resins include, for example, epoxy systems, formaldehyde systems, urethane/urea systems, formaldehyde systems, furan systems, allyl systems, alkyd systems, unsaturated polyester systems, vinyl ester systems, and the like. Epoxy systems include cycloaliphatic epoxies, diglycidyl ether of bisphenol-A or its brominated versions, tetraglycidyl methylene dianiline, polynuclear phenol epoxy, epoxy phenol novolac, epoxy cresol novolac, hydantoin epoxies, and so forth. As understood, epoxy resin systems can be processed in a variety of manners and can be cured at low or elevated temperatures. Low viscosity resins can be cast or used to impregnate reinforcements. Molding compounds can be injection molded, compression molded, or transfer molded. Electrical applications of epoxies abound and include encapsulation (potting) of semiconductor components, or the manufacture of laminated printed circuit boards or integrated circuits, and so forth. Epoxies modified by this invention also can be used in fiber-reinforced composites, and as other structural components. The formaldehyde systems include urea-formaldehydes, phenol formaldehydes, and melamine formaldehydes. The thermoplastics can be noncrystallizing thermoplastics and crystallizing thermoplastics. Examples of thermoplastics that can incorporate the self-healing system of this invention include olefinics, vinylics, styrenics, acrylonitrilics, acrylics, polycarbonates, polyalloys, cellulosics, polyamides, thermoplastic polyesters and copolyesters, sulfones, imide polymers, ether-oxide polymers, ketone polymers, fluoropolymers, and heterochain polymers, and the like. Elastomers that can be enhanced by this invention include vulcanizable elastomers, reactive system elastomers and thermoplastic elastomers. Examples of such elastomers include diene and related polymers, elastomeric copolymers, ethylene-related elastomers, fluoroelastomers, silicone polymers, and thermoplastic elastomers.

In one preferred aspect, the polymeric compound should be formulated to minimize any potential inhibiting activity by it relative to the polymerization reaction between the polymerizable material and the polymerization agent.

Formation of Self-Healing Polymer Composition

The thermoset, thermoplastic and elastomeric materials that can be enhanced by the self-healing ingredient described herein can be used in a wide variety of general applications such as for shaped materials (e.g., molded polymeric objects), adhesives, coatings, encapsulants, and so forth. For example, adhesives that can be enhanced by the invention include, for example, acrylates, methacrylates, cyanoacrylate resins, epoxy resins, phenoplasts such as phenolic resins, aminoplasts such as melamine-formaldehydes, unsaturated polyester resins, vinyl ester resins, polyurethanes, and so forth. Adhesive coating materials are also encompassed by the invention.

The microencapsulation particles described herein can be admixed with the polymeric matrix material at any convenient time prior to hardening of the polymeric matrix material. As a practical matter, the polymerization agent generally will be attached to the surfaces of the microcapsules prior to the introduction of the microcapsules and polymerization agent into the polymer or polymer-forming mix. For example, the microencapsulation particles could be introduced during the compounding of a polymeric matrix resin. If the polymeric matrix material will be shaped into a desired geometry before hardening by a technology having high shear forces and the like associated with it, such as injection molding or extrusion, care should taken that the microcapsules be engineered to tolerate the shaping conditions without prematurely rupturing.

Otherwise, the polymeric composites of the present invention can be shaped into desired shapes by any convenient technology, including, for example, lamination (such as form making fiber-reinforced plastics and structural composites using fiber preforms or fiber prepregs, and so forth), injection molding (such as for making microelectronic parts, watch components, locating pins, bushings, ribs, flanges, dashboards, outdoor furniture, and so forth), extrusion (such as for making sheets, pipes, fibers, pellets, and so forth), extrusion covering (such as for making sheathing for wires and cables), film blowing (such as for making single or multi-layer covers, and packaging applications such as wrap, can lining, bags, and so forth), calendering (such as for making flat films or sheets), sheet thermoforming (such as for making blister packs, individual containers, structural panels and liners, windows, skylights, and so forth), blow molding (such as for making packaging and storage containers), coating on a substrate (such as for films, tapes, structural skins, flooring, wall coverings, and so forth), rotational molding (such as for making open containers, seamless flotation devices, toys, structural components), casting (such as for making encapsulated, embedded or potted electronic parts), compression molding (such as for making electrical and electronic goods, knobs, buttons, closures, eating utensils, tire parts, and so forth), and transfer molding (such as for making complex or fragile polymeric products).

Although not forming part of the invention necessarily, other optional additives can be included as needed or desired in the polymeric composites of the invention, in addition to the polymerization agent-bearing microencapsulation particles described herein, to the extent they do not have an antagonistic (reducing) effect on the function of the microencapsulation particles. These optional additives can include, for example, u.v. stabilizers, heat stabilizers, antioxidants, colorants, flame retardants, antimicrobials, odorants, surface-modifying additives, processing aids, plasticizers, bulk modifiers, fillers, and reinforcements. Suitable examples of these optional additives include those that are generally known and available in contemporary polymeric material processing and design. For instance, the fillers and reinforcements may include commonly used materials as needed or desired, such as silica fibers, carbon fibers, metal fibers, metal powders, glass flakes, mica, aluminum flakes, kaolin, alumina trihydrate, calcium carbonate, carbon black, solid glass microspheres, hollow microspheres, The non-optional additives generally will form part of the discontinuous phase of the composite. As with the microencapsulation particles, these optional additives also generally will be introduced into the polymeric matrix at the some time before it is hardened. In the case of thermosetting resins, such as epoxies, the additives generally will be added to the polymer-forming mix before curing the resin.

By placing the polymerization agents in tandem with the healing agents using the microcapsules as carriers for both the polymerization agent and self-healing reagent, clumping of the self-healing composites is reduced. It also significantly increases the probability of self-healing taking place since the polymerization agent is attached to the microcapsules that contain the self-healing agent versus having the polymerization agent scattered about the polymeric matrix. This invention permits more efficient use of materials in the self-healing composite. For instance, only one material needs to be mixed into the polymeric matrix to impart the self-healing functionality, instead of separate addition of polymerization agent and microcapsules. This invention allows for greater selectivity in polymerization agents and better more homogenous dispersion. In some applications, even a single microcapsule may be adequate for healing, and therefore can be distributed in a single thin layer. In addition, by placing the polymerization agent on specific surfaces, versus a dispersed second phase of homogenous polymerization agent, this technique permits engineering of the self-healing reaction directly on the surfaces of reinforcement materials and fillers which are designed to blunt or divert crack growth. Diffusion of the polymerization agent to the damaged area does not need to occur for the self-healing reaction of this invention to occur. Also, a novel mixture of self-healing reagents permits engineering of the material properties. Additionally, the advantage of using the compliant healing material is that it can dissipate the applied stress. The self-healing system of the present invention modifies the local stress state, and it thereby reduces the chances of re-occurring fracture. Also, by placing the self-healing polymerization agent directly on the surface of the microcapsules, crack repair is accomplished at the interface between the polymeric matrix and the microcapsule reinforcement material. This invention also eliminates the need to uniformly mix the polymeric matrix resin, polymerization agent, and repair material from separate phases in the matrix resin and the attendant concerns over material homogeneity.

Figure 1:
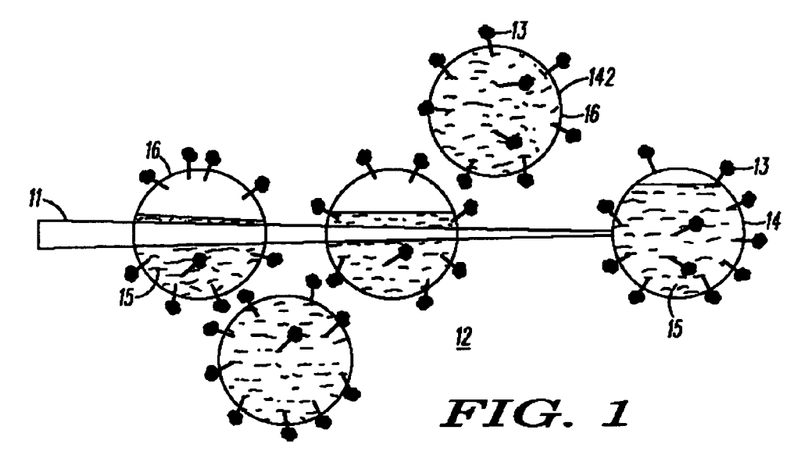
FIG. 1 is a schematic representation of a self-healing system for a polymer-containing material according to an embodiment of the invention.

FIG. 1 is a schematic representation of a new self-healing system 10 according to an embodiment of the present invention in which a fracture or a crack 11 in a polymeric matrix 12 is healed by rupture and release of contents of the microencapsulation particles 16. The microencapsulation particles 16 comprise microcapsules 14, which are hollow microspheres or microballoons. The microcapsules 14 contain polymerizable healing agent 15 inside them. The healing agent is introduced via microencapsulation. Polymerization agent 13 has been integrally attached at a plurality of different sites on the exterior surfaces 142 of the microcapsules 14. The stresses associated with propagating crack 11 rupture microencapsulation particles in its proximity, releasing their healing agent contents, which flow into contact with the crack and the polymerization agent attached to the microspheres so that the healing agent polymerizes at the crack, effectively filling the crack planes and preventing further propagation. The microencapsulation particles 16 serve as ready-to-use microreactors located in situ within the polymeric matrix to stop and repair fractural damage as it occurs within the polymeric matrix.

Figure 2:
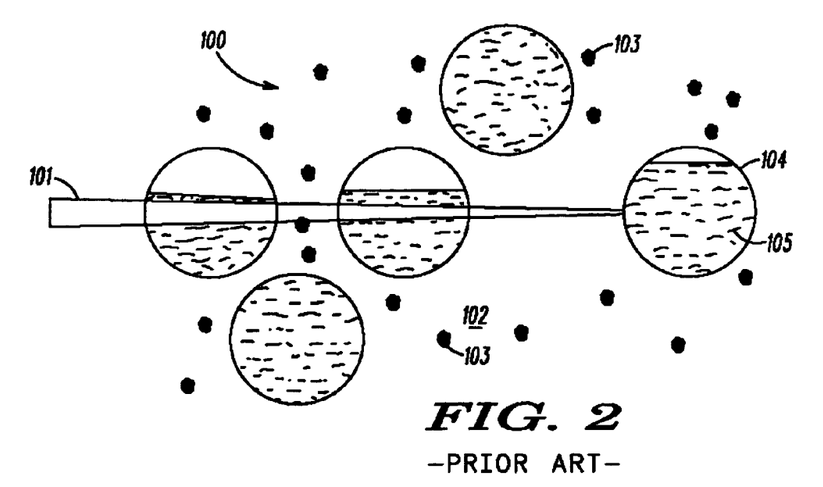
FIG. 2 is a schematic representation of a prior self-healing system for a polymeric-containing material for sake of comparison.

By comparison, FIG. 2 is a schematic representation of a prior self-healing system 100 in which a fracture or a crack 101 in a polymeric matrix 102 has been healed by the use of a homogenous polymerization agent 103 that is dispersed in the polymeric matrix 102. Microcapsules 104 filled with polymerizable healing agent 105 have been separately dispersed in the polymeric matrix 102. Visual examinations under magnification have been made of compact tension specimens used in strength measurements. The specimens employed separate dispersions in a polymeric matrix of a ruthenium salt polymerization polymerization agent, and urea-formaldehyde microcapsules ranging in size from 100 to 200 micrometers and contained a DCPD healing agent in the microcapsules. These examinations revealed that the polymerization agent clumps, and it is not finely dispersed in the matrix material resulting in wasted polymerization agent. Moreover, the homogenous polymerization agent approach results in the polymerization agent being dispersed in areas (volumes) of the polymeric matrix where there are no available healing microcapsules. Therefore, while a self-healing effect can be achieved with the use of a homogenous polymerization agent, it nonetheless has been discovered that problems exist with that self-healing system which may reduce or limit the performance and versatility of the technology.

Among other advantages and benefits, the present invention provides a self-healing polymeric composite material, such as illustrated in FIG. 1, where clumping of the self-healing components introduced into the polymer to be protected is significantly reduced if not eliminated. Using and applying the descriptions herein, the molecular structure of the microcapsule components can be designed and their properties, such as reaction rate and so forth, selected and adjusted to better fit the application envisioned. The molecular entities selected for the microcapsule components also can be engineered to change their reactivity, and sensitivity to the surrounding polymer matrix, as applicable or needed.

Figure 3:
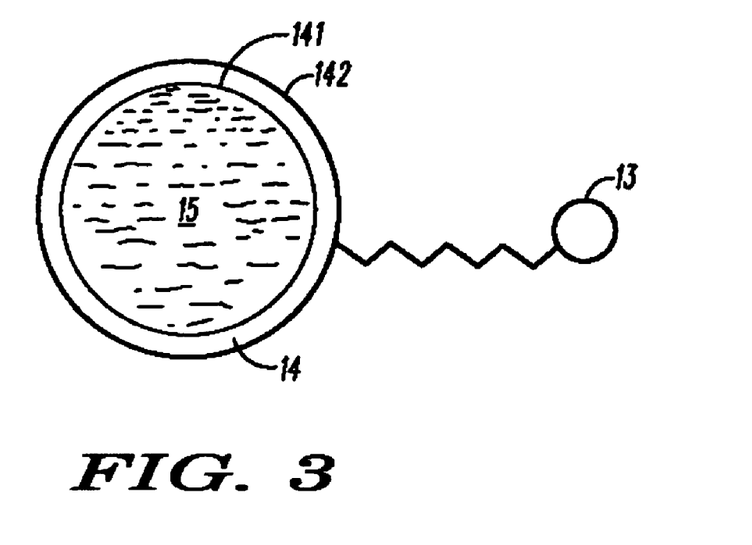
FIG. 3 is an enlarged partial view of one microcapsule 14 depicted in FIG. 1.
Figure 4:
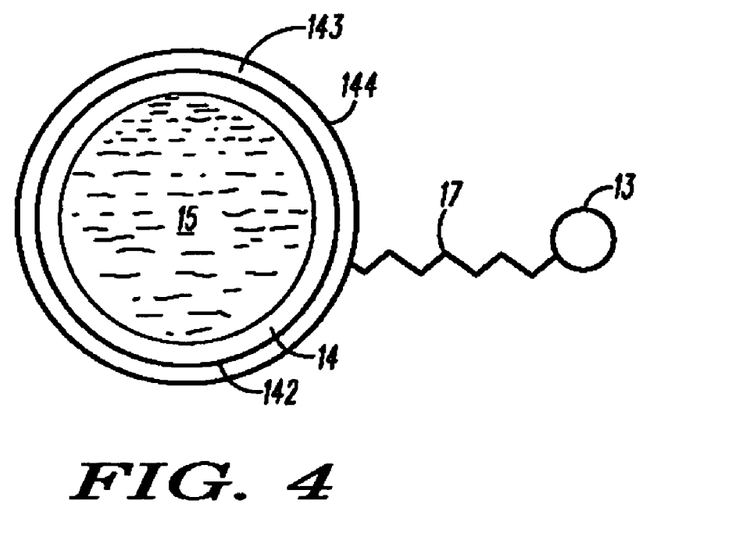
FIG. 4 illustrates the surface of a microcapsule having been coated with a thin film that serves as the surface upon which the polymerization agent has been attached to the microcapsule according to another embodiment of the invention.

FIG. 3 is an enlarged view of one microcapsule 14 depicted in FIG. 1. The microcapsule 14 encapsulates healing agent 15, which is enclosed by the interior void defined by the microcapsule wall 141. Polymerization agent 13 is attached to the exterior surface 142 of the microcapsule 14. To simplify the discussion, a single molecule of polymerization agent 13 is shown as attached to the surface 142 of microcapsule 14 in FIG. 3. In reality and practice, the polymerization agent material will be attached to the exterior or outer surface of the microcapsule at a very large number of separate sites around the exterior surface. It will be appreciated that the multiplicity of discrete molecules of polymerization agent material 13 will be attached to the surface of each microcapsule 14 before the surface-modified microcapsules are introduced into the polymeric matrix 12, as indicated in FIG. 2. In another embodiment shown in FIG. 4, the original surface 142 of the microcapsule 14 has been coated with a thin metal film 143, such as gold, which serves as the surface 144 upon which the polymerization agent 13 has been attached to the microcapsule 14 containing the self-healing agent 15. At the interface of metal film 143 and the exterior surface 142 of microcapsule 14, a surface specific bonding agent 17, which is described in more detail above, has been applied.

Figure 5:
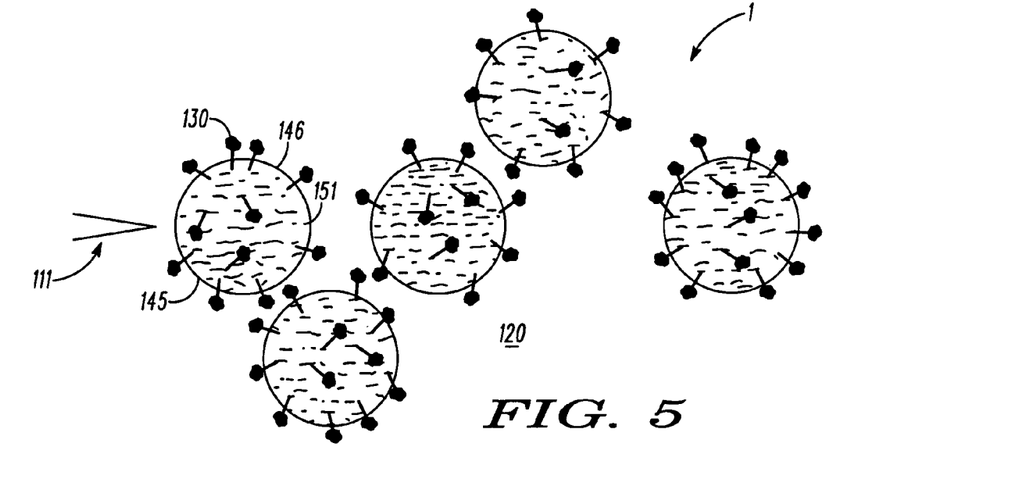
FIGS. 5, 6, and 7 schematically illustrate three stages of a self-healing process for a polymer-containing product using a system according to an embodiment of the present invention.
Figure 6:
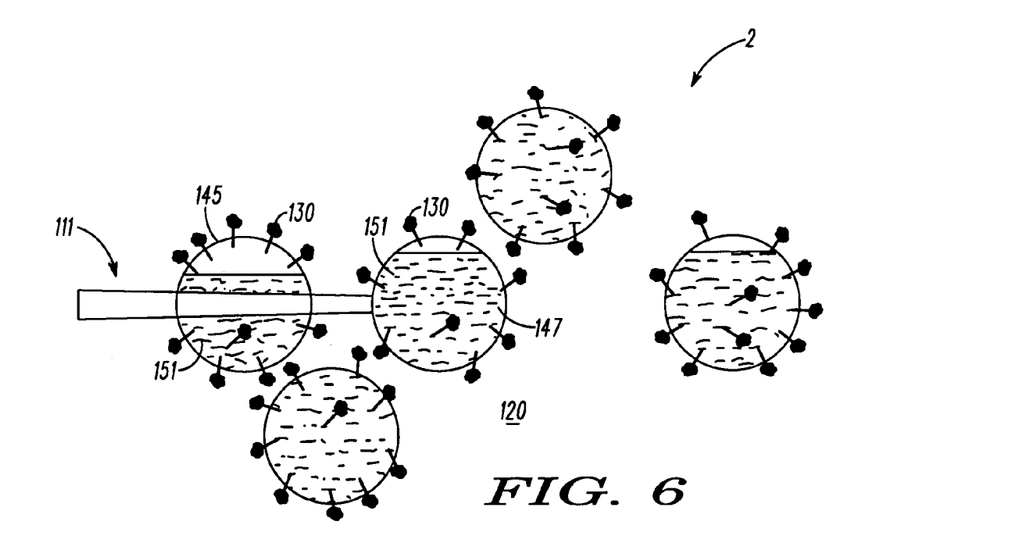
Figure 7:
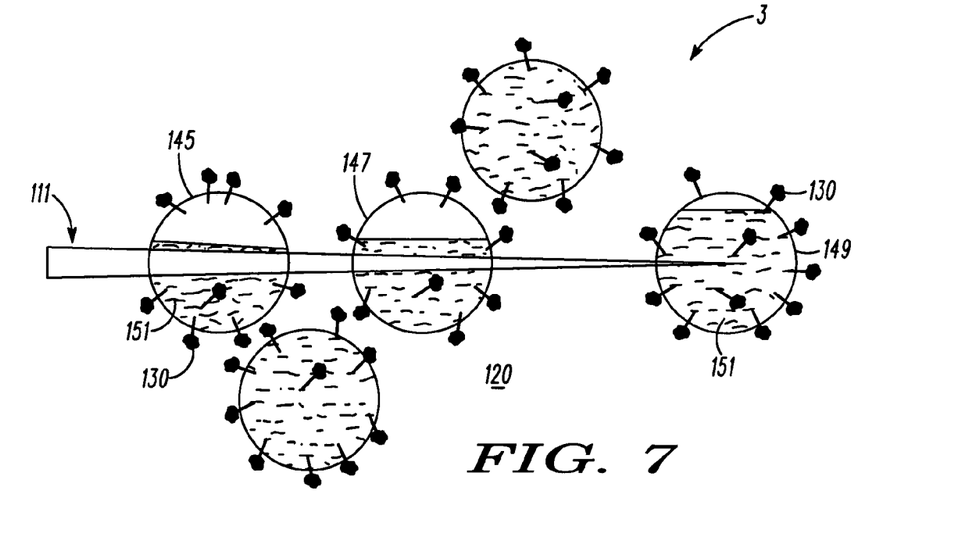

FIGS. 5, 6 and 7 schematically illustrate three stages of self-healing process using a system according to an embodiment of the present invention such as illustrated in FIG. 1. It will be appreciated that this represents one of many scenarios that can lead to the release and subsequent polymerization of the healing agent and is not intended to limit the scope of the teachings presented here. In FIG. 5, a first stage 1 is depicted representing the onset of fracture. The process begins with a propagating crack 111 in a polymeric matrix 120 that approaches one of the microcapsules 145 that contains healing agent 151 and has polymerization agent 130 attached to its exterior surface 146. In FIG. 6, a second stage 2 is depicted representing rupture of microcapsule 145 as crack 111 further propagates through the polymeric matrix 120 such that the self-healing agent 151 is released from the microcapsules 145 and 147. The released healing agent contacts the fracture surfaces of crack 111 and contacts polymerization agent 130 attached to the exterior of microcapsules 145 and 147. As illustrated, microcapsule 145 comes into proximity with the crack 111 first, and more healing agent has been released from it by this stage than for microcapsule 147 (for this example and does not necessarily represent all possible cases). FIG. 7, a third stage 3 is depicted showing the advance of the healing polymerization process to yet another microcapsule 149 to rupture it which begins the release of its healing agent 152 to contact polymerization agent 130 attached it. Meanwhile, the polymerization agent on microcapsules 145 and 147 has more fully contacted healing agent 150 released from those previously ruptured microcapsules. As a result, the polymerization agent 130 induces polymerization of the healing agent 150, resulting in filling of the two crack planes, arresting propagation of cracking 111 and reducing the compliance of the post-fractured matrix material, thereby healing the fractured polymeric matrix.

Figure 10:
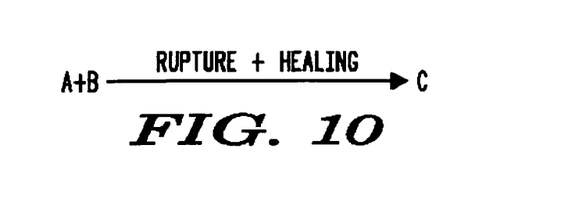
FIG. 10 illustrates a flow diagram summarizing the polymer healing mechanism as associated with a polymer composition according to this invention as illustrated in FIG. 1.
Figure 11:
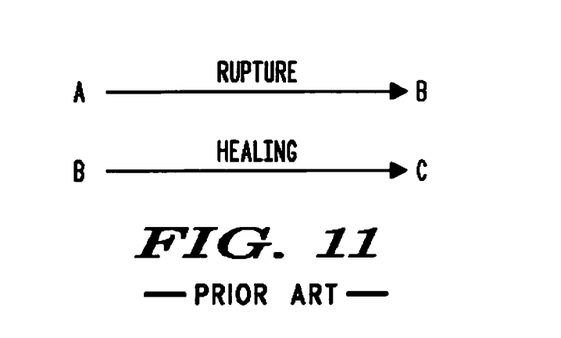
FIG. 11 illustrates a flow diagram summarizing a different polymer healing mechanism as associated with a comparison polymer composition illustrated in FIG. 2.

Referring now to FIG. 10 and FIG. 11, the flow diagram illustrated in FIG. 10 reflects the polymer healing mechanism such as associated with the polymer composition illustrated in above-discussed FIG. 1, while the flow diagram illustrated in FIG. 11 reflects the different polymer healing mechanism such as associated with the comparison polymer composition illustrated in above-discussed FIG. 2. In FIG. 10, the rupture of the microcapsule and leakage of its contents, event "A", and the coming into contact of the leaked contents with the polymerization agent attached upon the microcapsule exterior surface, event "B", occurs simultaneously or essentially simultaneously from a temporal standpoint, such that healing starts immediately and proceeds rapidly until the polymerization, event "C", advances sufficiently to heal the crack. However, by comparison, and as shown by the flow chart of FIG. 11, the healing process associated with the comparison composition of FIG. 2 will occur more slowly than that of FIG. 1. Still referring to FIG. 11, there will be a noticeable time lag between microcapsule rupture, A, and the later time when the leaking microcapsule contents ultimately contact any polymerization agent dispersed as a separate particulant in the polymeric matrix material, B, such that the onset and rate of the healing process and extent thereof is much slower for the polymer composition of FIG. 2 as compared to that of FIG. 1.

Examples of applications of the self-healing systems of the present invention include printed circuit board (PCB) laminates, polymeric housings, polymeric enclosures, adhesives, die attach, component packaging, and organic semiconductors. However, the technology presented here is also applicable to other polymeric goods, in addition to those that may have already been mentioned above, which also may have similar or analogous polymer degradation processes or could benefit by in situ capability to fix cracks and fractures. For example, the self-healing systems of the present invention can be applied to polymers used in plastic packaging, sporting goods, structural composites such as found in airframe structures, aircraft, aerospace, automotive, trucking, adhesives, paints, sealants, impregnating resins, finishes, coatings, and so forth.

Figure 12:
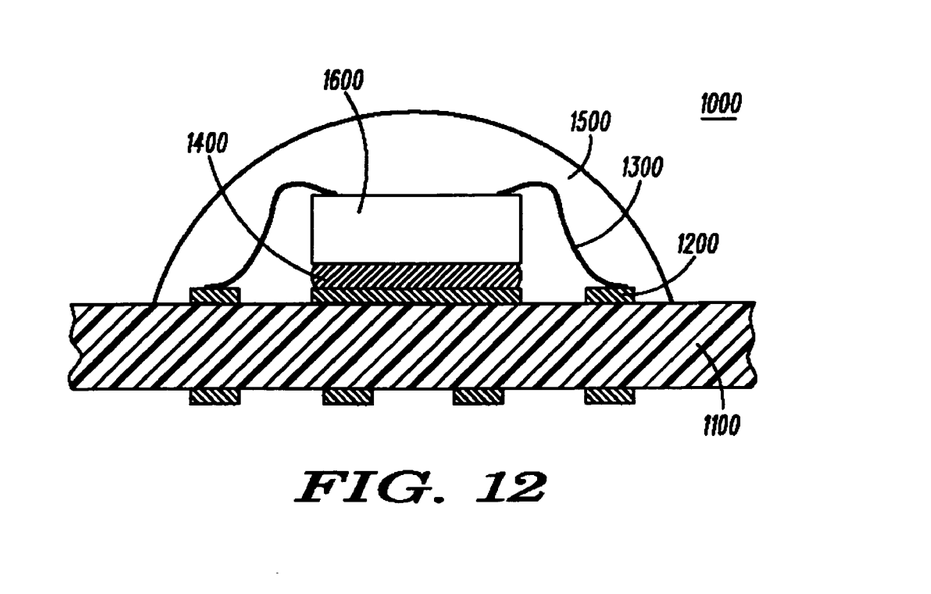
FIG. 12 illustrates an electronic package and a printed circuit board laminate that includes a self-healing system in accordance with another embodiment of the invention.

FIG. 12 illustrates an embodiment for implementing a self-healing system in an electronic package 1000 in accordance with an embodiment of the invention. An integrated circuit die or semiconductor device 1600 is electrically and mechanically attached to electrical conductors 1200 on printed circuit board (PCB) 1100. The PCB 1100 comprises an electrically insulating material, such as a fiberglass-reinforced resin, typically used in a laminated construction. For example, the laminate material 1100 can be epoxy glass, such as FR4 for example, involving a construction of numerous layers (e.g., between about 2–5 layers) of glass weaves within an epoxy resin. Individually or collectively, once the epoxy resin is cured, the layers are stiff yet flexible particles. Polyimide also can be used to form flexible circuit boards, but polyimide is typically more expensive than epoxy glass. The electrical conductors 1200 are formed on the PCB using any suitable process, for example, by photo-imaging and chemically etching. An array of solder pads, not shown, also could be provided on the back side of the PCB 1100 to aid in connecting the PCB 1100 to another component, such as a second PCB (not shown). The die 1600 is bonded to a region of the PCB 1100 using, for example, a suitable adhesive 1400 such as conductive adhesive filled with silver. The die 1600 is electrically interconnected via gold, tin-plated copper, or aluminum wires 1300 to the electrical conductors 1200. It will be understood that the wires 1300 comprise any suitable electrical conductors connected with any suitable bond. For example, the wires 1300 can comprise ultrasonically bonded wires, Tape Automated Bonding (TAB), or flip chip bonding. One could also use direct chip attach assembly (also called flip chip assembly), where the die is attached with solder spheres to metal pads on the substrate 1100. To enhance thermal fatigue reliability the space between the silicon and substrate is filled with adhesive (underfill) using capillary forces to drive the resin to the center of the die. This underfill can also incorporate the self-healing composite structure described herein.

A glob top coating or encapsulant 1500 is deposited over the die 1600, wires 1300, portions of the electrical conductors 1200, and portions of the PCB 1100. The encapsulant 1500 is deposited while in a viscous state and flows to cover the affected areas. After deposition of the encapsulant 1500, it is cured to a solid form by exposure to heat or other cross-linking means, which hardens the encapsulant.

In one embodiment, at least one of the resins used to make the PCB 1100, the die attach adhesive 1400, and the encapsulant 1500, includes a base resin containing the self-healing composites described herein. Numerous resins are candidate materials as the polymeric matrix resin used for this application, for example, epoxies, urethanes, silicones, polyimides, polyesters, organosilicon resins, and copolymers and blends thereof. These resins typically will be curable resins that are electrically insulating, moisture resistant, adhesive, and exhibiting a coefficient of thermal expansion substantially matching that of any adjoining component. In one particular embodiment, the polymeric matrix resin containing the self-healing composites is an epoxy resin used in the PCB 1100. Although not limited thereto, the electronic package 1000 may find particular use in portable communication applications and information processing devices used for that purpose.

The microencapsulated particles are not necessarily limited for use in polymeric matrices. For instance, polymerization agent-bearing microencapsulated particles made according to principles of this invention also may have utility as a treatment delivery system in certain biomedical and pharmaceutical applications in which a biocompatible microcapsule can be surface-modified with a polymerization agent for a therapeutic agent microencapsulated within the microcapsules. The therapeutic agent will be in a flowable form under conditions at which it can be expected to be released for administration in or on a patient. For biomedical applications, the microcapsules may be made of organic gel materials, or other biodegradable materials suited for microencapsulation processing.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A self-healing polymer composition comprising:
a polymer media; and
a plurality of microcapsules of flowable polymerizable material dispersed in the polymer media,
the microcapsules of flowable polymerizable material including microcapsules, flowable polymerizable material inside the microcapsules and at least one polymerization agent chemically attached to an outer surface of at least some of the microcapsules via a molecular bridging unit, the microcapsules effective for rupturing with a failure of the polymeric media and the flowable polymerizable material reacting with the polymerization agent upon rupture of the microcapsules.

2. The self-healing composition of claim 1, further including solvent inside the microcapsule in an amount effective to facilitate flow of the polymerizable material upon rupture of the microcapsule.

3. The self-healing composition of claim 1, wherein the microcapsule includes a metal film on its outer surface, the metal film effective for chemically attaching a polymerization agent to the microcapsule.

4. The self-healing composition of claim 3 further including a matrix layer comprising thiol moieties chemically attached to the metal film, a linear molecule of the molecular bridging unit having a backbone and opposite first and second ends attached from the first end thereof to the thiol moieties of the matrix layer and including carbon-carbon double bonds along the backbone and at the second end having a group selected from a norbornenyl group, a norbornenyl derivative group, and combinations thereof, which incorporates the polymerization agent.

5. The self-healing composition of claim 1, wherein the molecular bridging unit comprises a linear molecule chemically attached to the outer surface of the microcapsule, and wherein the polymerization agent comprises a derivative of $BF_3$ chemically attached to the outer surface of the microcapsule through the linear molecule.

6. The self-healing composition of claim 1, wherein the polymerization agent is selected from the group consisting of derivatives of aluminum (III), titanium (IV), tin (V), and mixtures thereof.

7. The self-healing composition of claim 1 wherein the microcapsule includes a shell defining an interior space with the flowable polymerizable material therein.

8. The self-healing composition of claim 1 wherein the microcapsule shell comprises a material selected from the group consisting of hydrous metal oxide, silica, silicate, carbon, polymer, and mixtures thereof.

9. The self-healing composition of claim 1 wherein the outer surface of the microcapsule is treated with a bonding agent effective for chemically attaching the polymerization agent to the microcapsule.

10. The self-healing composition of claim 9 wherein the bonding agent is a silanization agent.

11. The self-healing composition of claim 1 wherein the flowable polymerizable material is selected from the group consisting of norbornene, alkyl-substituted norbornene derivatives, alkoxysilynorbornenes, dicyclopentadiene, dicyclopentadiene oligomers, dicyclopentadiene copolymers, and mixtures thereof.

12. The self-healing composition of claim 1 wherein the flowable polymerizable material is selected from the group consisting of trimethoxysilylnorbornene, norbornene, ethyl norbornene, propylnorbornene, butylnorbornene, hexylnorbornene, dicyclopentadiene, and mixtures thereof.

13. The self-healing composition of claim 1 wherein the polymerization agent is selected from the group consisting of a ruthenium complex, an osmium complex, an indium complex, and mixtures thereof.

14. The self-healing composition of claim 1 wherein the polymerization agent is selected from the group consisting of a ruthenium complex derived from $RuCl_3$, $K_2RuCl_5$, $Ru(H_2O)_6$-$(tos)_2$ where tos is toluene sulfonate, and mixtures thereof.

15. The self-healing composition of claim 1 wherein the polymer media is selected from the group consisting of thermoset, thermoplastic, elastomeric, and mixtures thereof.

* * * * *